(12) United States Patent
Toshima et al.

(10) Patent No.: US 10,114,089 B2
(45) Date of Patent: Oct. 30, 2018

(54) NMR MEASURING PROBE

(71) Applicant: JEOL Ltd., Tokyo (JP)

(72) Inventors: Katsuyuki Toshima, Tokyo (JP); Shinji Nakamura, Tokyo (JP); Shigenori Tsuji, Tokyo (JP)

(73) Assignee: JEOL Ltd., Tokyo (JP)

( * ) Notice: Subject to any disclaimer, the term of this patent is extended or adjusted under 35 U.S.C. 154(b) by 155 days.

(21) Appl. No.: 15/403,474

(22) Filed: Jan. 11, 2017

(65) Prior Publication Data

US 2017/0205479 A1    Jul. 20, 2017

(30) Foreign Application Priority Data

Jan. 14, 2016   (JP) .................. 2016-004961

(51) Int. Cl.
  *G01V 3/00*   (2006.01)
  *G01R 33/34*  (2006.01)
  *G01R 33/30*  (2006.01)
(52) U.S. Cl.
  CPC ......... *G01R 33/3403* (2013.01); *G01R 33/30* (2013.01); *G01R 33/34092* (2013.01)
(58) Field of Classification Search
  USPC ........................................ 324/322
  See application file for complete search history.

(56) References Cited

U.S. PATENT DOCUMENTS

| 5,508,613 | A  | 4/1996 | Kotsubo et al. |
| 7,378,847 | B2 | 5/2008 | Barbara et al. |
| 2005/0052184 | A1 | 3/2005 | Haner et al. |
| 2009/0121718 | A1* | 5/2009 | Yamamoto ....... G01R 33/34053 324/322 |
| 2013/0178367 | A1* | 7/2013 | Tsuji .............. G01R 33/34023 505/162 |

(Continued)

FOREIGN PATENT DOCUMENTS

| EP | 1435525 A2 | 7/2004 |
| WO | 2006026541 A2 | 3/2006 |

OTHER PUBLICATIONS

Office Action issued in EP 17150846.8 dated Feb. 21, 2018.

(Continued)

*Primary Examiner* — Rodney Fuller
(74) *Attorney, Agent, or Firm* — The Webb Law Firm

(57) ABSTRACT

A sample tube is arranged in a sample temperature adjusting pipe, and a temperature adjustment gas is supplied. A vacuum vessel is formed with the sample temperature adjusting pipe and an outer wall body, and a detection coil and the like to be placed in a cooling state are arranged in the vacuum vessel. A sealed section between the sample temperature adjusting pipe and the outer wall body is sealed by a sealing structure. The sealing structure includes a high-vacuum O-ring and a low-temperature O-ring. The high-vacuum O-ring has characteristics for sealing the sealed section in a regular temperature region. The regular temperature region is a temperature region excluding a low temperature region, and the low temperature region is a temperature region including a lower limit in a possible temperature adjustment range of the temperature adjustment gas. The low-temperature O-ring has characteristics for sealing the sealed section in the low temperature region.

5 Claims, 10 Drawing Sheets

(56) References Cited

U.S. PATENT DOCUMENTS

2015/0168518 A1* 6/2015 Hirose ............ G01R 33/34007
                                                    324/318
2015/0268314 A1   9/2015 Peterson
2016/0223628 A1*  8/2016 Fujiwara ............ G01R 33/282

OTHER PUBLICATIONS

Elastomere Medienbestandigkeit, 2008, pp. 1-14, XP055379904, Retrieved from the Internet: URL:http://www.ckd-dichtungstechnik.de/download/medienbestaendigkeit.pdf [retrieved on Jun. 9, 2017].

* cited by examiner

NMR MEASURING PROBE

CROSS REFERENCE TO RELATED APPLICATION

The entire disclosure of Japanese Patent Application No. 2016-004961 filed on Jan. 14, 2016 including the specification, claims, drawings, and abstract is incorporated herein by reference in its entirety.

TECHNICAL FIELD

The present disclosure relates to an NMR measuring probe, and particularly to a vacuum technology in a cooling type NMR measuring probe.

BACKGROUND

As magnetic resonance measuring devices, there are known a nuclear magnetic resonance (NMR) measuring device and an electron spin resonance (ESR) measuring device. As devices similar to the NMR measuring device, there is also known a magnetic resonance imaging (MRI) device. Hereinafter, the NMR measuring device will be explained.

The NMR is a phenomenon that a nucleus placed in a static magnetic field interacts with an electromagnetic wave having a natural frequency. The NMR measuring device measures a sample at an atomic level utilizing the phenomenon. The NMR measuring device is put to practical use in the analyzation of organic compounds (for example, chemicals, agricultural chemicals), high-polymer materials (for example, vinyl and polyethylene), biological materials (for example, nucleic acid or protein), and the like. By using the NMR measuring device, it is possible to determine a molecular structure of the sample, for example.

In the NMR measuring device, an NMR measuring probe (NMR signal detecting probe) is arranged together with the sample in a superconducting magnet generating a static magnetic field. The NMR measuring probe is provided with a coil for transmission and reception. The coil has a function of giving a variable magnetic field to the sample during the transmission and detecting an NMR signal of the sample during the reception. Since a resonance frequency differs depending upon a nucleic kind of an observed object, a high-frequency signal having a specific frequency adapted to the nucleic kind of the observed object is given to the coil during the sample measurement.

The cooling type NMR measuring probe is known as one kind of NMR measuring probe. In the cooling type NMR measuring probe, a vacuum vessel is used, and individual components (particularly in a detection system) in the vacuum vessel are placed in a low temperature state. An example of cooled target components present in the vacuum vessel may include a detection coil for detecting an NMR signal, and elements (a variable capacitor, a fixed capacitor, and the like) constituting a detection circuit. As a result of the cooling, an electrical resistance of the detection coil is decreased and a Q value is increased. In addition, an electrical heat noise is lowered. A high level of sensitivity is made possible by these effects. The sample itself is placed under atmospheric pressure (normal pressure), or under room temperature or temperature-controlled circumferences. In a device described in U.S. Pat. No. 7,378,847 or International Publication No. WO 2006/026541, a high vacuum is required as a vacuum degree in the vacuum vessel for avoiding vacuum discharge that may be generated in the detection coil.

In general, in the cooling type NMR measuring probe, a sample tube is accommodated in a gas pipe for sample temperature adjustment. The gas pipe for sample temperature adjustment is inserted in an outer wall body constituting the cooling type NMR measuring probe. Thereby a vacuum vessel is configured with the gas pipe for sample temperature adjustment and the outer wall body, and the vacuum vessel is reduced in internal pressure and cooled. A temperature in the gas pipe for sample temperature adjustment is maintained at room temperature. Alternatively, temperature adjustment gases are supplied into the gas pipe for sample temperature adjustment to control the internal temperature. A sealed section between the gas pipe for sample temperature adjustment and the outer wall body is generally sealed by a sealing member such as an O-ring made of a rubber material or the like, in consideration of limitation of amount space, assembly easiness of the probe, adjustment easiness thereof, and the like. The sealing member made of the rubber material is crushed in the sealed section by its elasticity, whereby a clearance in the sealed section is reduced to zero to realize the sealing. When the temperature adjustment gas is supplied to control a temperature in the gas pipe for sample temperature adjustment, a temperature of the sealing member also changes in response to this controlled temperature. When the gas pipe for sample temperature adjustment is internally cooled, the sealing member is also cooled, and when the gas pipe for sample temperature adjustment is internally heated, the sealing member is also heated.

In a case of controlling a sample temperature in the cooling type NMR measuring probe, it is preferable to be able to enlarge a possible temperature adjustment range of the temperature adjustment gas without deteriorating the vacuum degree in the vacuum vessel. For example, it is preferable that it is possible to lower the lower limit in the temperature adjustment range. However, in a case of using the sealing member made of the rubber material, it is difficult to lower the lower limit in the temperature adjustment range without deteriorating the vacuum degree. The cause of lowering the vacuum degree may generally include the following two causes. The first is, a sealing member embrittles to reduce elasticity of the sealing member and form a clearance in the sealed section, and a leak is generated through the clearance to lower the vacuum degree. The second is, in a case where a sealing member itself has a high gas permeability rate, a leak is generated through the sealing member to lower the vacuum degree.

As a sealing member low in a gas permeability rate, there is known a sealing member made of a fluorinated rubber material. Since the sealing member itself has a low gas permeability rate, it is possible to prevent or suppress a reduction in vacuum degree due to gas permeation. However, in a low temperature range (for example, in a range equal to −40° C. or less), the sealing member embrittles to lose elasticity, which causes lowering of the vacuum degree. As the sealing member that does not embrittle even in the low temperature region and maintains elasticity, there is known a sealing member made of a silicone rubber member. According to this sealing member, it is possible to prevent or suppress a reduction in vacuum degree due to the embrittlement of the sealing member in the low temperature region. However, since the sealing member itself has a high gas permeability rate in a regular temperature range (for example, −20° C. or more), the vacuum degree deteriorates in the regular temperature range.

As described above, it is difficult to realize both of the non-embrittlement of the sealing member in the low temperature region and the low gas permeability rate in the regular temperature region, and it is difficult to enlarge the temperature adjustment range without deteriorating the vacuum degree.

It is an advantage of the present disclosure to enlarge a possible temperature adjustment range of a temperature adjustment gas without deteriorating a vacuum degree within a vacuum vessel in an NMR measuring probe.

SUMMARY

An NMR measuring probe according to the present disclosure comprises an inner wall body having a tubular hollow cavity that accommodates therein a sample vessel and in which a temperature adjustment gas is supplied, an outer wall body in which the inner wall body is inserted and that constitutes a vacuum vessel together with the inner wall body, an NMR signal detector that is arranged inside the vacuum vessel and is placed in a cooling state, and a sealing structure for sealing a sealed section between the inner wall body and the outer wall body, wherein the sealing structure includes a first sealing member having characteristics for sealing the sealed section in a regular temperature region excluding a low temperature region including a lower limit in a possible temperature adjustment range of the temperature adjustment gas, and a second sealing member that is provided on a vacuum side or an atmosphere side to the first sealing member in the sealed section and has characteristics for sealing the sealed section in the low temperature region in the temperature adjustment range.

In the above configuration, the temperature adjustment gas is supplied into the inner wall body, and thereby a sample temperature is controlled. A temperature of the sealing structure also changes following this control. In the sealing structure, the first sealing member primarily functions, and the second sealing member supplementarily functions. That is, in the regular temperature region excluding the low temperature region, the first sealing member works to seal the sealed section, thereby preventing or suppressing deterioration of the vacuum degree in the vacuum vessel. In the low temperature region, the second sealing member works to seal the sealed section, thereby preventing or suppressing deterioration of the vacuum degree in the vacuum vessel. Since the low temperature region includes the lower limit in the possible temperature adjustment range of the temperature adjustment gas, it is possible to prevent or suppress the deterioration of the vacuum degree in the vacuum vessel also in the lower limit of the temperature adjustment range. Thereby, as compared to a case of using the first sealing member only, it is possible to lower the lower limit in the temperature adjustment range without deteriorating the vacuum degree in the vacuum vessel. Since it is possible to prevent or suppress the deterioration of the vacuum degree in the temperature region including the regular temperature region and the low temperature region by using both of the first sealing member and the second sealing member, it is possible to enlarge the temperature adjustment range without deteriorating the vacuum degree in the vacuum vessel as compared to a case of using only one of the first and second sealing members.

An embrittlement temperature of the first sealing member may be a first temperature, and an embrittlement temperature of the second sealing member may be a second temperature that is lower than the first temperature and is lower than the lower limit. The embrittlement temperature is a temperature that causes the sealing member to be hardened, and the sealing function is damaged at that temperature. Since the embrittlement temperature of the second sealing member is lower than the lower limit in the temperature adjustment range, the second member is not hardened in the lower limit and normally functions as a sealing member. As a result, the sealed section is normally sealed in the low temperature region as well.

The first sealing member may be made of a fluorinated rubber material, and the second sealing member may be formed of a silicone rubber material.

The second sealing member may be provided on an atmosphere side to the first sealing member in the sealed section.

The second sealing member may be provided on a vacuum side to the first sealing member in the sealed section.

According to the present disclosure, it is possible to enlarge the possible temperature adjustment range of the temperature adjustment gas without deteriorating the vacuum degree in the vacuum vessel.

BRIEF DESCRIPTION OF DRAWINGS

Embodiment(s) of the present disclosure will be described based on the following figures, wherein.

DESCRIPTION OF EMBODIMENTS

Figure 1:
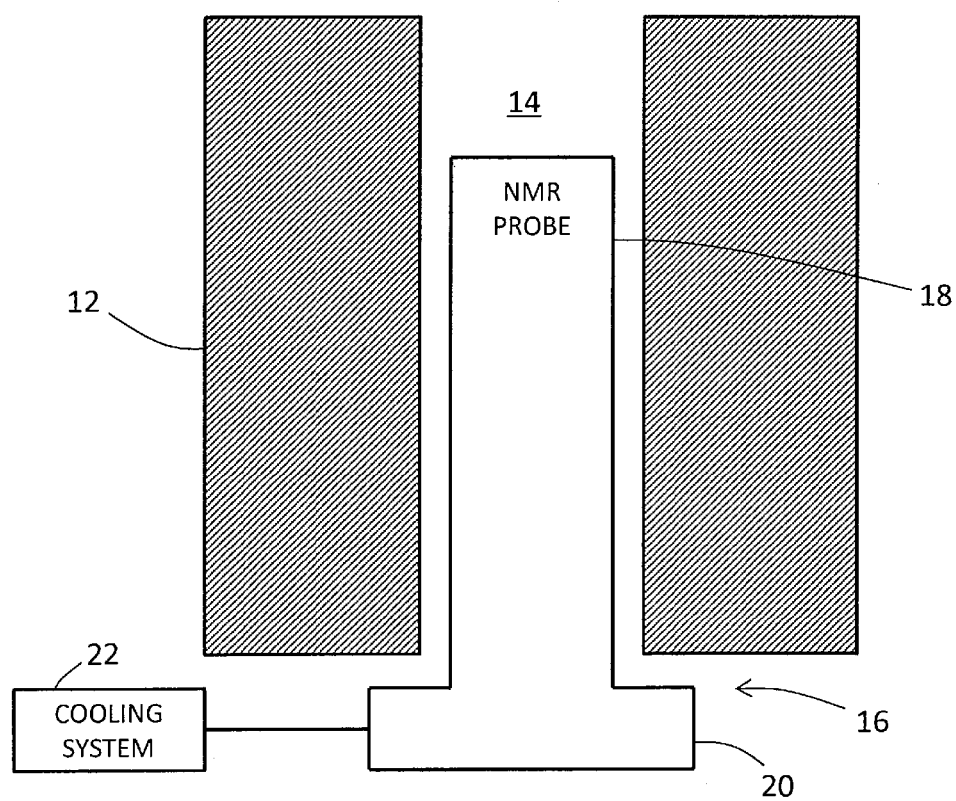
FIG. 1 is a conceptual diagram illustrating an NMR measuring device according to an embodiment of the present disclosure.

FIG. 1 illustrates an example of an NMR measuring device 10 according to an embodiment of the present disclosure. The NMR measuring device 10 is a device that measures an NMR signal generated by an observed nucleus in a sample.

A static magnetic field generating device 12 is a device that generates a static magnetic field, and is provided with a bore 14 formed in the central section as a hollow cavity part extending in a perpendicular direction. An NMR probe 16 is a cooling type NMR measuring probe and is schematically configured with an insert portion 18 and a base portion 20. The insert portion 18 has a cylindrical shape extending in the perpendicular direction as a whole, and is inserted in the bore 14 of the static magnetic field generating device 12. In the NMR probe 16, the vacuum vessel is used and individual components (cooled target components) in the vacuum vessel are placed in a low temperature state.

A cooling system 22 includes, for example, a refrigerating machine, and supplies a helium gas cooled by the refrigerating machine to the NMR probe 16, thereby cooling the cooled target components in the NMR probe 16. For example, the cooled target component is cooled to approximately 10K to 80K.

In FIG. 1, illustration of a transmission/reception unit, a spectrometer, and the like included in the NMR measuring device 10 is omitted.

Figure 2:
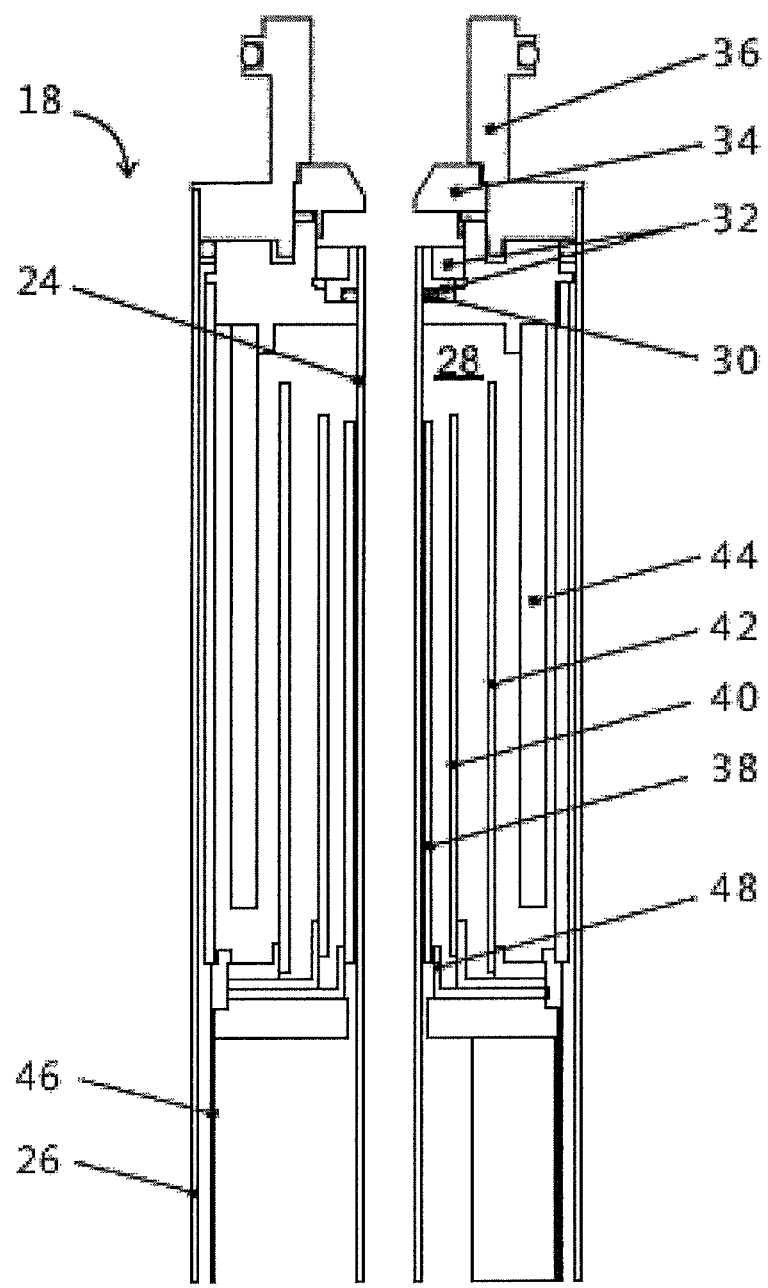
FIG. 2 is a cross section illustrating an NMR probe according to the embodiment.

Hereinafter, the NMR probe 16 will be in detail explained with reference to FIG. 2. FIG. 2 illustrates a cross-section surface of the insert portion 18 in the NMR probe 16.

In the insert portion 18 of the NMR probe 16, a sample temperature adjusting pipe 24 serving as an inner wall body is inserted in an outer wall body 26 serving as a probe cover. The sample temperature adjusting pipe 24 is a quartz glass tube having a cylindrical hollow cavity, for example. A sample tube for accommodation of a sample is arranged in the sample temperature adjusting pipe 24. The insert portion 18 is placed in the bore 14 of the static magnetic field generating device 12 in such a manner that a center of the sample is aligned with the magnetic field center. The sample temperature adjusting pipe 24 internally forms an atmospheric space. A temperature adjustment gas (VT (variable temperature) gas) for controlling a temperature of a sample is supplied into the sample temperature adjusting pipe 24 from downward. The VT gas controlled to the temperature within the temperature adjustment range is supplied into the sample temperature adjusting pipe 24, and thereby the temperature of the sample is controlled to the temperature within the temperature adjustment range. The lower limit of the temperature adjustment range is determined by characteristics of the sealing structure to be described later.

A vacuum vessel 28 is formed as an airtight chamber between the sample temperature adjusting pipe 24 and the outer wall body 26. The vacuum vessel 28 is internally reduced in pressures to a vacuum state. As an example thereof, the vacuum vessel 28 is internally reduced in pressure to approximately $1 \times 10^{-5}$ Pa. A sealing structure is formed on a top section of the insert portion 18 to seal a sealed section (top sealed section) between the sample temperature adjusting pipe 24 and the outer wall body 26, and a sealing structure is formed also on a lower section of the insert portion 18 to seal a sealed section (lower sealed section) between the sample temperature adjusting pipe 24 and the outer wall body 26. A sealing structure 30 including O-rings is formed on the top sealed section. For example, the sealing structure 30 is formed between a side face of a top flange of the outer wall body 26 and a side face of the sample temperature adjusting pipe 24, to seal the section. As described later, two O-rings are used as the sealing structure. The O-ring is fixed by an O-ring fixing portion 32. Thereby the sealing is realized on the top section of the insert portion 18. Likewise, a sealing structure including O-rings is formed on a low sealed section as well. Two O-rings are used as the sealing structure, which are fixed by an O-ring fixing portion. Thereby the sealing is realized on the lower section of the insert portion 18. These sealing structures ensure airtightness between the sample temperature adjusting pipe 24 and the outer wall body 26.

A sample introducing guide 34 and a sample stator 36 are provided on the top section of the sample temperature adjusting pipe 24. The sample introducing guide 34 is a mechanism for guiding introduction of a sample tube into the sample temperature adjusting pipe 24. The sample tube is introduced into the sample temperature adjusting pipe 24 through the sample introducing guide 34. The sample stator 36 is a mechanism for holding the sample tube introduced into the sample temperature adjusting pipe 24.

NMR signal detectors (an observing coil 38 and an exciting coil 40 serving as detection coils, a tuning variable capacitor, a matching variable capacitor, and the like) are provided in the vacuum vessel 28 under a reduced pressure of a vacuum. The observing coil 38 and the exciting coil 40 are provided as a detection circuit pattern formed on a substrate, for example. Needless to say, detection coils other than these may be used. A shield 42, a gradient magnetic field coil 44, a resonance circuit cover 46, and the like are placed in the vacuum vessel 28. The observing coil 38 and the exciting coil 40 are held on the lower sections by a coil holder 48 (stage).

In the above configuration, the NMR signal detectors including the detection coil correspond to cooled target components, and are cooled to an extremely low temperature. For improving S/N of signals, the variable capacitor is cooled together with the detection coil. For example, a cooling system (cryostat cooling system) described in Japanese Patent Laid-Open Publication No. 2014-41103 can be used as the cooling mechanism.

Figure 3:
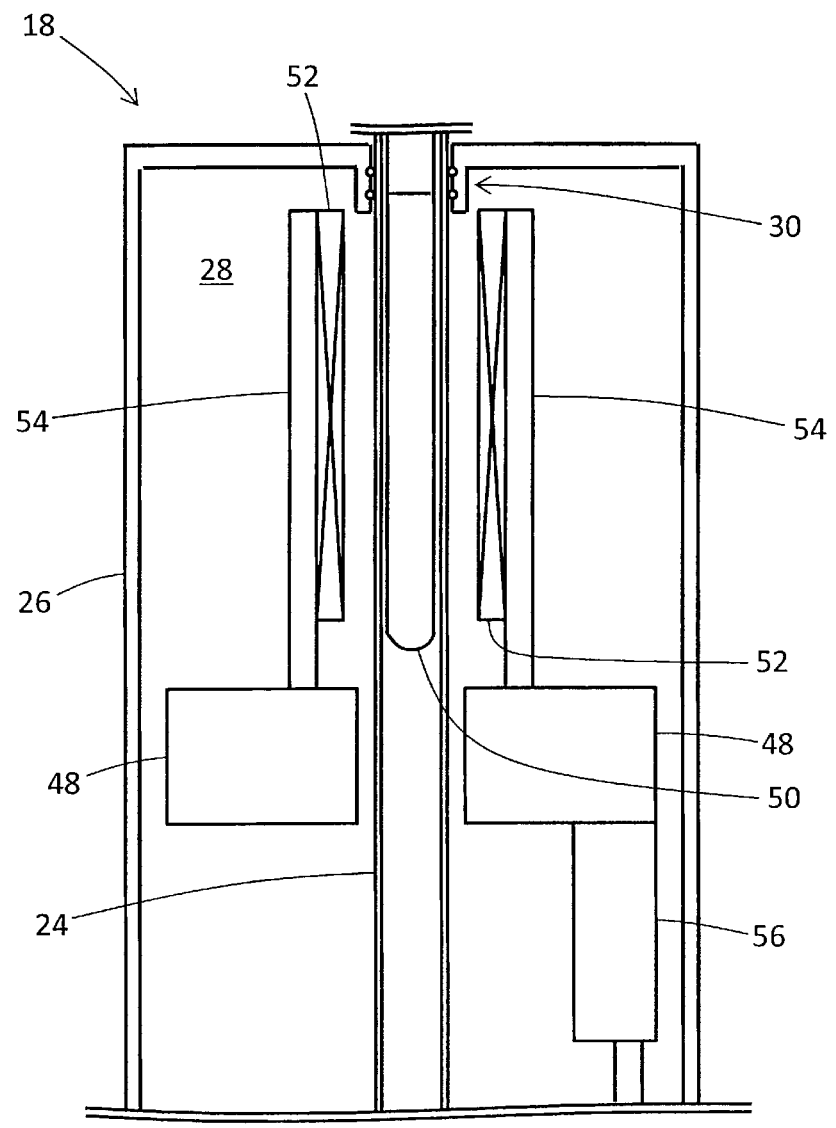
FIG. 3 is a schematic cross section illustrating the NMR probe according to the embodiment.

FIG. 3 illustrates the cooling mechanism. FIG. 3 is a cross section illustrating an outline of the insert portion 18 in the NMR probe 16. A sample tube 50 in which a sample is accommodated is arranged in the sample temperature adjusting pipe 24. An example of the sample may include a liquid. Detection coils 52 including the observing coil 38 and the exciting coil 40 are arranged in the vacuum vessel 28. The detection coils 52 are placed on a substrate 54, and the substrate 54 is held by the coil holder 48. In FIG. 3, illustration of the O-ring fixing portion 32, the sample introducing guide 34, the sample stator 36, the shield 42, the gradient magnetic field coil 44, and the resonance circuit cover 46 is omitted.

A heat exchanger 56 is connected to the coil holder 48 (stage). The cooled helium gas is introduced from the cooling system 22 illustrated in FIG. 1, which cools the heat exchanger 56 to an extremely low temperature (for example, approximately 10K to 80K). As a result, the cooled target components such as the detection coils 52 are cooled. An electrical resistance of the detection coil 52 is reduced to increase a Q value by cooling the detection coil 52. Electrical thermal noises are reduced. As a result, it is possible to improve detection sensitivity at the NMR measuring. An unillustrated temperature sensor is mounted on the NMR probe 16, and a temperature of the cooled target component is detected by the temperature sensor.

Figure 4:
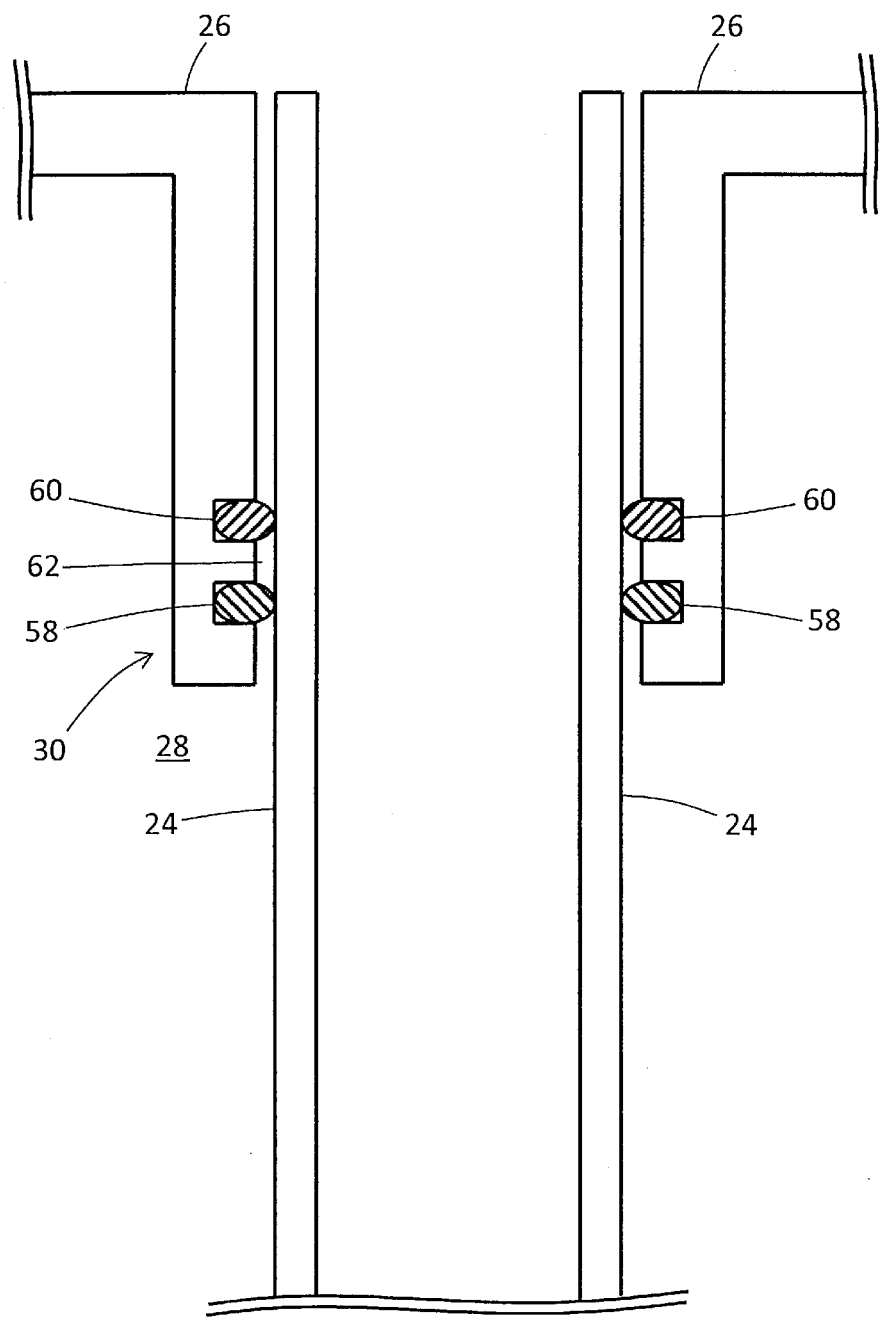
FIG. 4 is a cross section illustrating an example of a sealing structure.

Next, the sealing structure 30 will be described in detail with reference to FIG. 4. FIG. 4 is a cross section illustrating an example of the sealing structure 30. FIG. 4 illustrates the sealing structure 30 on the top section of the insert portion 18. The sealing structure 30 is a sealing structure by a so-called radial sealing method.

The sealing structure 30 is provided on a flange on the top section of the outer wall body 26, and includes a high-vacuum O-ring 58 serving as a first sealing member and a low-temperature O-ring 60 serving as a second sealing member. The high-vacuum O-ring 58 and the low-temperature O-ring 60 are placed in a sealed section between the sample temperature adjusting pipe 24 and the outer wall body 26, and have a function of sealing the sealed section. Specifically, the high-vacuum O-ring 58 and the low-temperature O-ring 60 are placed between a side face of the flange in the outer wall body 26 and a side face of the sample temperature adjusting pipe 24 to make contact with the side faces to seal the sealed section. In the example illustrated in FIG. 4, the low-temperature O-ring 60 is arranged on an atmosphere side to the high-vacuum O-ring 58. A space 62 is formed between the high-vacuum O-ring 58 and the low-temperature O-ring 60. The high-vacuum O-ring 58 and the low-temperature O-ring 60 may have the same size or may differ in size from each other. A cross-sectional shape of each of the high-vacuum O-ring 58 and the low-temperature O-ring 60 may be a circular shape or a rectangular shape. A cross-sectional shape of a groove in which each of the high-vacuum O-ring 58 and the low-temperature O-ring 60 is placed may be a rectangular shape or a triangular shape. As an example thereof, an inner diameter of each of the high-vacuum O-ring 58 and the low-temperature O-ring 60 is 6.8 mm, a thickness thereof is 1.9 mm, and an outer diameter thereof is 10.6 mm.

The high-vacuum O-ring 58 has characteristics for sealing the sealed section in a regular temperature region. The regular temperature region is a temperature region excluding a low temperature region. The low temperature region is a temperature region including the lower limit in the possible temperature adjustment range of the temperature adjustment gas (VT gas). The low-temperature O-ring 60 has characteristics for sealing the sealed section in a low temperature region in the temperature adjustment range.

The high-vacuum O-ring 58 is made of, for example, a fluorinated rubber material, and the low-temperature O-ring 60 is made of, for example, a silicone rubber material. The high-vacuum O-ring 58 and the low-temperature O-ring 60 each made of rubber material are crushed in the sealed section by their elasticity, which causes realization of the sealing. An example of the high-vacuum O-ring 58 may include Viton®.

An embrittlement temperature (or glass transfer temperature, TR10 value (low-temperature elasticity recovery temperature)) of the low-temperature O-ring 60 is lower than an embrittlement temperature of the high-vacuum O-ring 58, and is lower than the lower limit in the temperature adjustment range. The embrittlement temperature is an index indicating a cold resistance, and is a temperature that causes an O-ring made of a rubber material to embrittle in the low temperature region and lose its elasticity.

The fluorinated rubber material is a material of low gas permeability rate. Therefore, the gas permeability rate in the high-vacuum O-ring 58 itself made of the fluorinated rubber material is low. The embrittlement temperature (for example, TR10 value) of the high-vacuum O-ring 58 is, for example, −20° C. to −40° C. That is, the high-vacuum O-ring 58 embrittles within a range of −20° C. to −40° C. The fluorinated rubber material is not degraded even in a temperature range of approximately 150° C. to 300° C.

The silicone rubber material is a material higher in a gas permeability rate as compared to the fluorinated rubber material. Therefore, the gas permeability rate in the low-temperature O-ring 60 itself made of the silicone rubber material is higher than that of the high-vacuum O-ring 58. On the other hand, the embrittlement temperature (for example, TR10 value) of the low-temperature O-ring 60 is a lower temperature than the embrittlement temperature of the high-vacuum O-ring 58, and is, for example, −80° C. to −90° C. That is, the low-temperature O-ring 60 embrittles within a range of −80° C. to −90° C. The silicone rubber material is not degraded even in a temperature range of, for example, approximately 150° C. to 300° C.

The possible temperature adjustment range of the VT gas is determined in consideration of characteristics of the high-vacuum O-ring 58 and the low-temperature O-ring 60. In a case where the low-temperature O-ring 60 having the TR10 value of −90° C. is used, a temperature (for example, −80° C.) higher than −90° C. is adopted as the lower limit of the temperature adjustment range. In this case, the temperature adjustment range is set as −80° C. to +150° C., for example. In a case where the low-temperature O-ring 60 having the TR10 value of −80° C. is used, a temperature (for example, −70° C.) higher than −80° C. is adopted as the lower limit of the temperature adjustment range. In this case, the temperature adjustment range is set as −70° C. to +150° C., for example. The upper limit of the temperature adjustment range may be approximately 220° C., depending upon characteristics of the rubber material used in the high-vacuum O-ring 58 and the low-temperature O-ring 60. These values are given only as examples, and the lower limit of the temperature adjustment range may be approximately −20° C. or −40° C. The lower limit of the temperature adjustment range can be further lowered by using the low-temperature O-ring 60 having the TR10 value of a lower temperature. In this way, the lower limit in the possible temperature adjustment range of the VT gas is determined by the TR10 value (the embrittlement temperature and glass transfer temperature) of the low-temperature O-ring 60.

Figure 5:
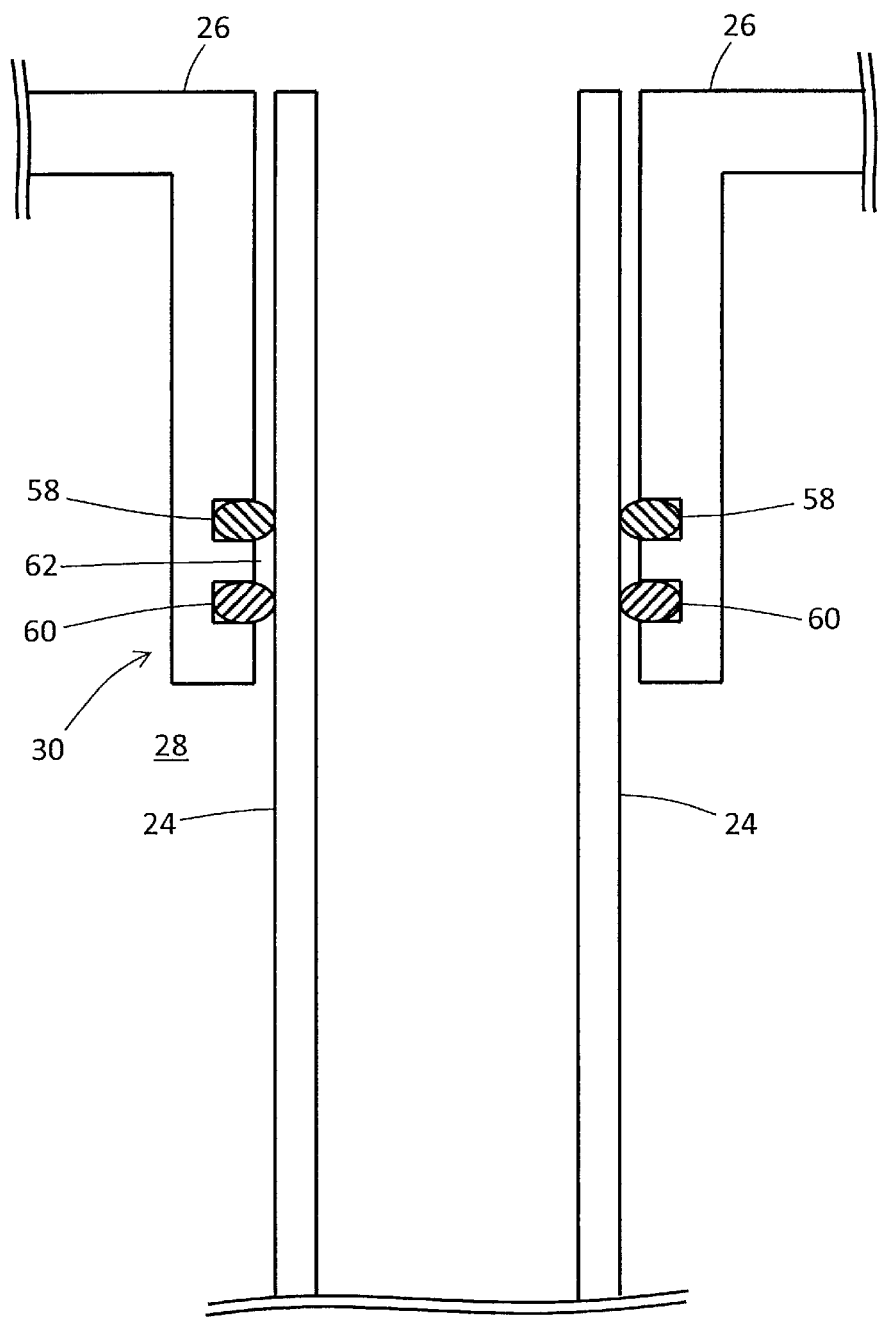
FIG. 5 is a cross section illustrating another example of a sealing structure.

FIG. 5 illustrates another example of the sealing structure 30 on the top section of the insert portion 18. FIG. 5 is a cross section illustrating another example of the sealing structure 30. In the example illustrated in FIG. 5, the low-temperature O-ring 60 is arranged on a vacuum side (vacuum vessel 28-side) in relation to the high-vacuum O-ring 58. The space 62 is formed between the high-vacuum O-ring 58 and the low-temperature O-ring 60.

Figure 6:
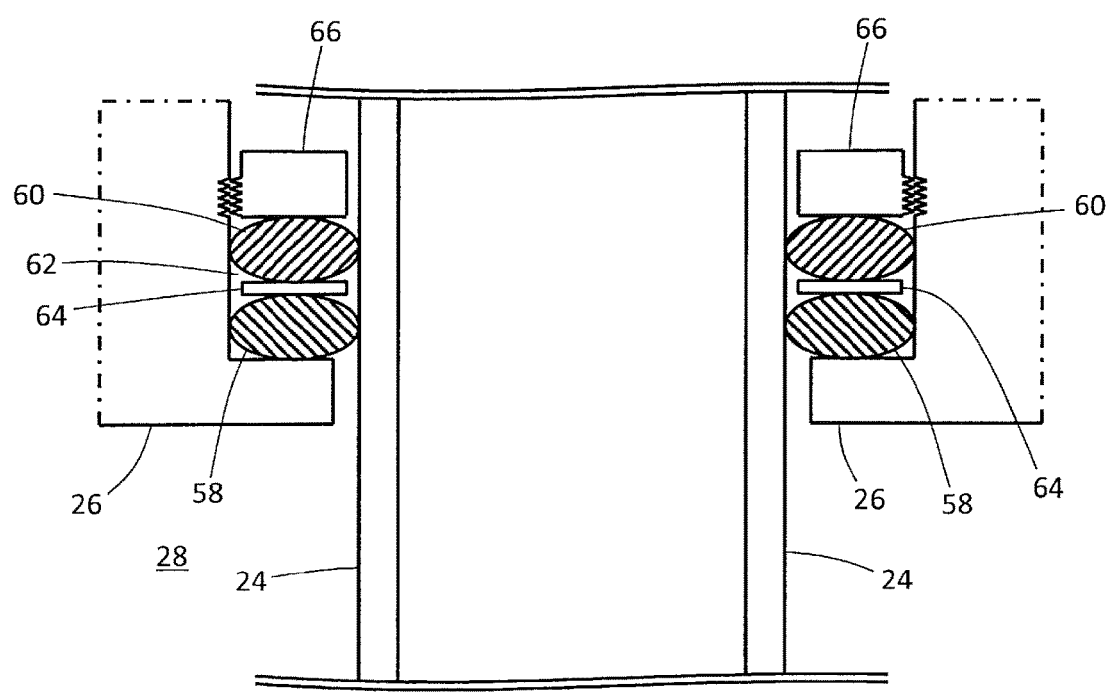
FIG. 6 is a cross section illustrating an example of a fixing method for a sealing member.

Next, a specific fixing method for the sealing member will be described in detail with reference to FIG. 6. FIG. 6 is a cross section illustrating the sealing structure 30 on the top section of the insert portion 18. In the example illustrated in FIG. 6, the high-vacuum O-ring 58 is arranged on a vacuum side (vacuum vessel 28-side) and the low-temperature O-ring 60 is arranged on an atmosphere side. Needless to say, the low-temperature O-ring 60 may be arranged on a vacuum side, and the high-vacuum O-ring 58 may be arranged on an atmosphere side.

A ring-shaped bolt 66 presses the high-vacuum O-ring 58 and the low-temperature O-ring 60 between the sample temperature adjusting pipe 24 and the outer wall body 26 for fixation with interposition of washer 64 between the high-vacuum O-ring 58 and the low-temperature O-ring 60. A screw groove to be fitted in a screw groove formed on a side face of the bolt 66 is formed on a face of the outer wall body 26 facing the sample temperature adjusting pipe 24. When the screw groove of the bolt 66 is fitted in the screw groove of the outer wall body 26 and the bolt 66 is fastened, the high-vacuum O-ring 58 and the low-temperature O-ring 60 are fixed in a crushed state. Thereby the sealing is realized.

Figure 7:
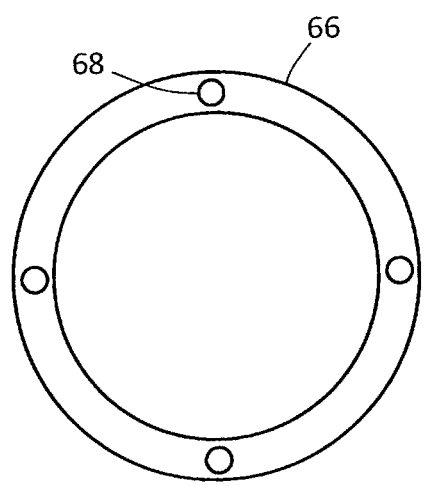
FIG. 7 is a top view of a bolt.

FIG. 7 illustrates an example of the bolt 66. FIG. 7 is a top view of the bolt 66. The bolt 66 is formed in a ring shape. One or a plurality of operating holes 68 are formed in the bolt 66. In the example illustrated in FIG. 7, four operating holes 68 are formed. The operating holes 68 rotate the bolt 66 between the sample temperature adjusting pipe 24 and the outer wall body 26 to cause the screw groove of the bolt 66 to be fitted in the screw groove of the outer wall body 26. An operator inserts the bolt 66 in between the sample temperature adjusting pipe 24 and the outer wall body 26, inserts bar-shaped members and the like into the operating holes 68, and rotates the bolt 66. The bolt 66 is fixed on the outer wall body 26 by this control, and the high-vacuum O-ring 58 and the low-temperature O-ring 60 are fixed in a pressed state.

Figure 8:
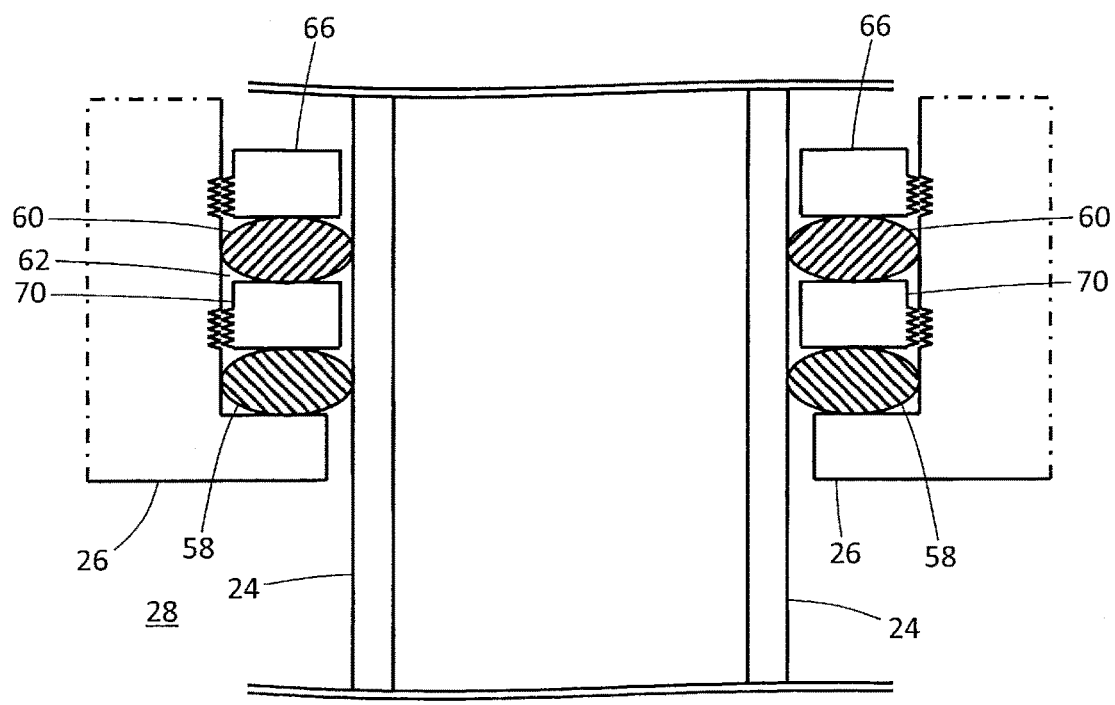
FIG. 8 is a cross section illustrating another example of a fixing method for a sealing member.

FIG. 8 illustrates another fixing method of the sealing structure. FIG. 8 is a cross section of the sealing structure 30 on the top section of the insert portion 18. A bolt 70 is used in place of the washer 64. In the example illustrated in FIG. 8, the high-vacuum O-ring 58 is arranged on a vacuum side (vacuum vessel 28-side), and the low-temperature O-ring 60 is arranged on an atmosphere side. Needless to say, the low-temperature O-ring 60 may be arranged on a vacuum side, and the high-vacuum O-ring 58 may be arranged on an atmosphere side.

A screw groove is formed on a side face of the bolt 70, similar to the case of the bolt 66. One or a plurality of operating holes 68 are formed on the bolt 70, similar to the bolt 66. Screw grooves to be fitted in screw grooves of the respective bolts 66, 70 are formed on a face of the outer wall body 26 facing the sample temperature adjusting pipe 24. The bolt 70 is arranged on the high-vacuum O-ring 58, the screw groove of the bolt 70 is fitted in the screw groove of the outer wall body 26, and the bolt 70 is fastened, whereby the high-vacuum O-ring 58 is fixed in a crushed state. Further, the low-temperature O-ring 60 is arranged on the bolt 70, and the bolt 66 is arranged on the low-temperature O-ring 60. The screw groove of the bolt 66 is fitted in the screw groove of the outer wall body 26 and the bolt 66 is fastened, whereby the low-temperature O-ring 60 is fixed in a crushed state. Thereby the sealing is realized.

Figure 9:
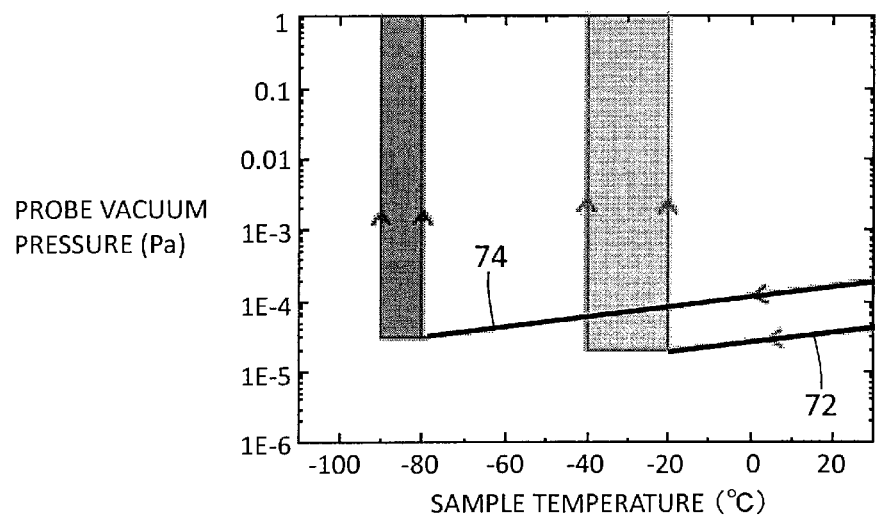
FIG. 9 is a graph illustrating a relation between a sample temperature (temperature of a sealing member) and a vacuum degree in a probe.

Next, an operation of the sealing structure 30 will be explained with reference to FIG. 9. FIG. 9 is a graph illustrating a relation between a sample temperature and a vacuum degree in a probe. A horizontal axis shows a sample temperature (° C.). A vertical axis shows a vacuum degree (Pa) in the vacuum vessel 28. When a VT gas is supplied into the sample temperature adjusting pipe 24, a temperature of a sample is controlled by the VT gas. A temperature of each of the high-vacuum. O-ring 58 and the low-temperature O-ring 60 making contact with the sample temperature adjusting pipe 24 is made close to a temperature of the VT gas (temperature of the sample) to be approximately equal to the temperature of the VT gas.

In FIG. 9, a graph 72 illustrates a relation between a sample temperature and a vacuum degree in a case of using only the high-vacuum O-ring 58 made of the fluorinated rubber material as a sealing member. A graph 74 illustrates a relation between a sample temperature and a vacuum degree in a case of using only the low-temperature O-ring 60 made of the silicone rubber material as a sealing member.

Here, a general elastic characteristic and gas permeability rate of an O-ring made of a rubber material will be explained. Elasticity of the O-ring made of the rubber material depends largely upon a molecular motion of a molecular chain structure of the rubber material. Therefore, when the temperature is lowered to weaken this motion, the elasticity of the O-ring is extremely lowered to cause embrittlement of the O-ring. In general, the larger a molecule-to-molecule distance, the larger the rotational of the molecular motion, thereby making molecular motion easier. Therefore, the longer the molecule-to-molecule distance, the lower the embrittlement temperature. That is, the low-temperature characteristics increase. On the other hand, the longer the molecule-to-molecule distance, since the gas permeability rate becomes higher, the vacuum degree deteriorates. In this case also, since the molecular motion is suppressed upon cooling, the gas permeability is suppressed (the gas permeability rate becomes low) and the vacuum degree becomes high.

Since the high-vacuum O-ring 58 is a sealing member of low gas permeability rate, as illustrated in the graph 72, a high vacuum (for example, approximately 2 to $4 \times 10^{-5}$ Pa) is maintained in the vacuum vessel 28 in a temperature region higher than the embrittlement temperature (for example, TR10 value). At this time, as the temperature is lowered, the molecular motion is further suppressed, and therefore the vacuum degree becomes higher with lower temperature. In a case of using the high-vacuum O-ring 58 having a TR10 value of −20° C., the high-vacuum O-ring 58 brittles at −20° C. to lose its elasticity. As a result, a clearance is generated in the sealed section and a leak is generated therefrom to deteriorate the vacuum degree. In a case of using the high-vacuum O-ring 58 having a TR10 value of −40° C., the high-vacuum O-ring 58 embrittles at −40° C. to deteriorate the vacuum degree. A temperature region higher than the TR10 value of the high-vacuum O-ring 58 corresponds to a regular temperature region, and a temperature region equal to or less than the TR10 value corresponds to a low temperature region. In a case of using the high-vacuum O-ring 58 having a TR10 value of −20° C., a temperature region equal to or higher than −20° C. corresponds to a regular temperature region, and a temperature region equal to or lower than −20° C. corresponds to a low temperature region. In a case of using the high-vacuum O-ring 58 having a TR10 value of −40° C., a temperature region higher than −40° C. corresponds to a regular temperature region, and a temperature region equal to or lower than −40° C. corresponds to a low temperature region. The upper limit of the regular temperature region is a temperature lower than a temperature causing the high-vacuum O-ring 58 and the low-temperature O-ring 60 to be degraded; for example, 150° C. or 300° C.

Since the low-temperature O-ring 60 is a sealing member having a high gas permeability rate, as illustrated in the graph 74, a vacuum degree in the vacuum vessel 28 is higher in the regular temperature region (for example, a temperature region of −20° C. or more) as compared to a case of using the high-vacuum O-ring 58 (for example, approximately 1 to $2 \times 10^{-4}$ Pa). On the other hand, as the temperature becomes lower, the molecular motion of the silicone rubber material constituting the low-temperature O-ring 60 is further suppressed to thereby lower the gas permeability rate. As a result, the vacuum degree becomes excellent. In a temperature region of approximately −80° C., the vacuum degree is approximately $3 \times 10^{-5}$ Pa, for example. In a case of using the low-temperature O-ring 60 having a TR10 value of −80° C., the low-temperature O-ring 60 embrittles at −80° C. to lose its elasticity. As a result, a clearance is generated in the sealed section and a leak is generated therefrom to deteriorate the vacuum degree. In a case of using the low-temperature O-ring 60 having a TR10 value of −90° C., the low-temperature O-ring 60 embrittles at −90° C. to thereby deteriorate the vacuum degree. Since the TR10 value of the low-temperature O-ring 60 is lower than the TR10 value of the high-vacuum O-ring 58, the low-temperature O-ring 60 does not embrittle even in a temperature region (low temperature region) equal to or less than the TR10 value of the high-vacuum O-ring 58.

In the present embodiment, both of the high-vacuum O-ring 58 and the low-temperature O-ring 60 having the characteristics as described above are used as the sealing members. In the regular temperature region (temperature region higher than the TR10 value of the high-vacuum O-ring 58), permeability of the gas is suppressed with an operation of the high-vacuum O-ring 58 of low gas permeability rate to maintain a high vacuum (for example, approximately 1 to $2\times10^{-5}$ Pa) in the vacuum vessel 28. Since the high-vacuum O-ring 58 embrittles in the low temperature region (temperature region equal to or less than the TR10 value of the high-vacuum O-ring 58), the high-vacuum O-ring 58 does not function as the sealing member. On the other hand, as the temperature is lowered, since the gas permeability rate of the low-temperature O-ring 60 becomes lower, the vacuum degree in the vacuum vessel 28 is maintained high (for example, approximately $3\times10^{-5}$ Pa to $1\times10^{-4}$ Pa). As a material of the low-temperature O-ring 60, a rubber material that suppresses the permeability of the gas may be used in the low temperature region where the high-vacuum O-ring 58 does not function as a sealing member. The lower limit in the possible temperature adjustment range of the VT gas is set to a temperature higher than the TR10 value (embrittlement temperature and glass transfer temperature) of the low-temperature O-ring 60. Thereby, in the temperature adjustment range, the high vacuum is maintained in the vacuum vessel 28.

A slope of the graph in FIG. 9 is given as only an example, and an actual slope differs depending upon a material to be actually used, but a tendency of the slope is the same as the tendency shown in the graph in FIG. 9.

As described above, in the regular temperature range the high vacuum is maintained in the vacuum vessel 28 with the operation of the high-vacuum O-ring 58. In the low temperature region where the sealing effect of the high-vacuum O-ring 58 does not function, the low-temperature O-ring 60 supplementarily works, and a relatively high vacuum is maintained in the vacuum vessel 28 with the operation of the low-temperature O-ring 60. As a result, it is possible to lower the lower limit in the possible temperature adjustment range of the VT gas without deteriorating the vacuum degree in the vacuum vessel 28 as compared to a case of using only the high-vacuum O-ring 58. It is possible to prevent or suppress the deterioration in the vacuum degree in the temperature region including the regular temperature region and the low temperature region by using both of the high-vacuum O-ring 58 and the low-temperature O-ring 60. Therefore, it is possible to enlarge the temperature adjustment range without deteriorating the vacuum degree in the vacuum vessel 28 as compared to a case of using only one sealing member of the two.

In a case of using only the high-vacuum O-ring 58 without using the low-temperature O-ring 60, the high vacuum is realized in the regular temperature region, but since the high vacuum is not maintained in the low temperature region, the lower limit of the temperature adjustment range cannot be lowered without deteriorating the vacuum degree. In a case of using only the low-temperature O-ring 60 without using the high-vacuum O-ring 58, a relatively high vacuum is realized in the low temperature region, but the vacuum degree deteriorates in the regular temperature region. In this way, in a case of using only either one of the high-vacuum O-ring 58 and the low-temperature O-ring 60, the high vacuum is not realized in one of the low temperature region and the regular temperature region. On the other hand, according to the present embodiment, it is possible to realize the high vacuum in both of the low temperature region and the regular temperature region, whereby the possible temperature adjustment range of the VT gas can be enlarged.

According to the present embodiment, since it is possible to lower the sample temperature to −40° C. or less while maintaining the high vacuum, an application of the measurement can be widened. For example, since there are some cases where the molecular motion is limited in −40° C. or less and unknown parameters are selectively eliminated to make molecular structure analysis easier, a demand for analysis of organic materials or catalyst materials is prospective.

Even in a case where an O-ring made of a rubber material is placed in a low temperature, only a physical change is basically generated in the O-ring, and when the temperature is returned back to room temperature, the original properties are restored. Therefore, even when the O-ring is placed in a temperature lower than the TR10 value, the O-ring does not suffer damage. On the other hand, in a case where an O-ring is placed in a high temperature, an irreversible chemical change is generated in the O-ring, and the deformation remains permanently. Therefore, the upper limit in the possible temperature adjustment range of the VT gas is determined such that the O-ring does not degrade.

In the present embodiment, as illustrated in FIG. 4, the high-vacuum O-ring 58 may be arranged on the vacuum side (vacuum vessel 28-side) and the low-temperature O-ring 60 may be arranged on the atmosphere side, or, as illustrated in FIG. 5, the high-vacuum O-ring 58 may be arranged on the atmosphere side and the low-temperature O-ring 60 may be arranged on the vacuum side. For descriptive purposes, the sealing structure 30 illustrated in FIG. 4 is called sealing method A and the sealing structure 30 illustrated in FIG. 5 is called sealing method B.

In the sealing method A, since the high-vacuum O-ring 58 arranged on the vacuum side normally functions as the sealing member in the regular temperature region, air in the air space 62 formed between the high-vacuum O-ring 58 and the low-temperature O-ring 60 is not vacuumed. That is, an air reservoir is formed in the air space 62. In this case, when the sample temperature is lowered to the TR10 value of the high-vacuum O-ring 58 or less, the low-temperature O-ring 60 supplementarily functions to maintain the interior of vacuum vessel 28 in a high vacuum state. Since the high-vacuum O-ring 58 embrittles at this time, the air in the space 62 leaks into the vacuum vessel 28. Since a volume of the space 62 is much smaller (vanishingly smaller) as compared to a volume in the vacuum vessel 28, even if the leak occurs, an influence of the leak on the vacuum degree in the vacuum vessel 28 is zero or very small.

According to the sealing method B, since the high-vacuum O-ring 58 arranged on the atmosphere side normally functions as the sealing member in the regular temperature region, the high vacuum is maintained in the vacuum vessel 28 including the space 62. That is, the air reservoir is not formed in the space 62. Therefore, it is possible to prevent the air in the space 62 from entering into the vacuum vessel 28. In a case of lowering the sample temperature to the TR10 value of the high-vacuum O-ring 58 or less, the air flows into the space 62. In this case, since the low-temperature O-ring 60 supplementarily functions, inflow of the air into the vacuum vessel 28 from the space 62 is prevented to maintain the interior of the vacuum vessel 28 in the high vacuum state. With regard to this point, the sealing method B is more advantageous than the sealing method A in which the air in the space 62 possibly enters into the vacuum vessel 28.

On the other hand, according to the sealing method B, the air in the space 62 is also vacuumed, and the time required for the vacuum degree in the vacuum vessel 28 to reach the high vacuum may become longer. As described above, since the volume of the space 62 is much smaller (vanishingly smaller) than the volume in the vacuum vessel 28, even if the air in the space 62 is also vacuumed, the time required for this vacuuming is possibly very short or zero. However, the screw grooves are formed in nuts and the like for fixing the O-ring, and it may take time to remove the air adhered to the screw groove and the like. With regard to this point, since there is no requirement in the sealing method A to vacuum the air in the space 62 in the regular temperature region, the sealing method A is more advantageous than the sealing method B.

As described above, since the sealing methods A and B each have a specific advantage, either one of the sealing methods A and B may be selected according to use environments, use conditions, measurement environments, measurement conditions, and the like.

Figure 10:
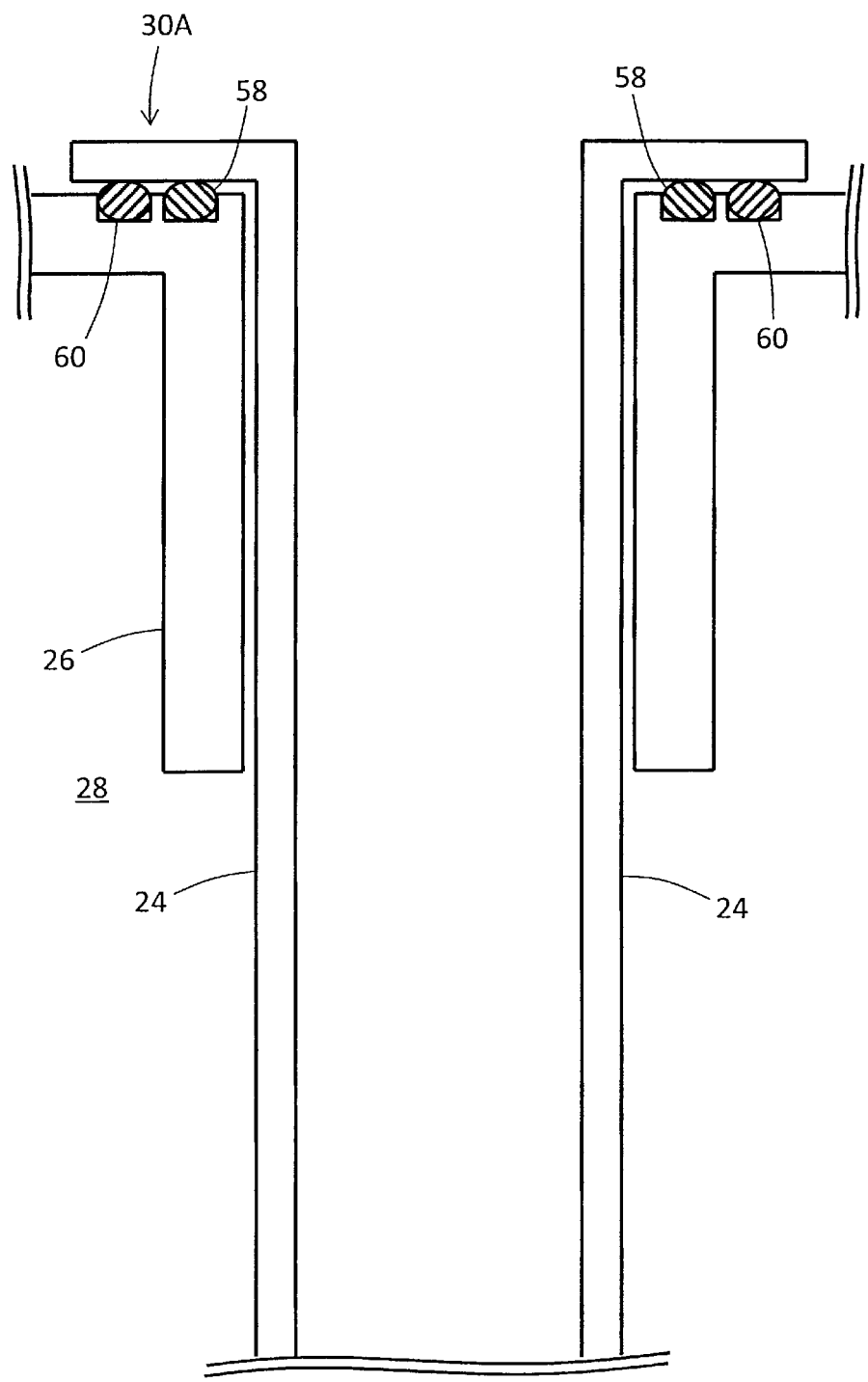
FIG. 10 is a schematic cross section illustrating an NMR probe according to a modification.

Hereinafter, an NMR probe according to a modification will be explained with reference to FIG. 10. FIG. 10 is a cross section illustrating a sealing structure according to the modification. FIG. 10 illustrates a sealing structure 30A on the top section of the insert portion 18. This sealing structure 30A is a sealing structure according to a so-called face sealing method.

The sealing structure 30A is, similar to the above sealing structure 30, provided on the flange of the top section in the outer wall body 26, and includes the high-vacuum O-ring 58 and the low-temperature O-ring 60. The top section of the sample temperature adjusting pipe 24 is bent to the outer side, and the high-vacuum O-ring 58 and the low-temperature O-ring 60 are placed between the top face of the flange in the outer wall body 26 and the bent section in the sample temperature adjusting pipe 24 to seal that section. In the example in FIG. 10, the high-vacuum O-ring 58 is arranged on the vacuum side (vacuum vessel 28-side) and the low-temperature O-ring 60 is arranged on the atmosphere side. This arrangement is shown as only one example, and similar to the above embodiment, the high-vacuum O-ring 58 may be arranged on the atmosphere side and the low-temperature O-ring 60 may be arranged on the vacuum side.

In the modification also, it is possible to maintain the high vacuum in the vacuum vessel 28 in the temperature region including the regular temperature region and the low temperature region. Thereby it is possible to enlarge the possible temperature adjustment range of the VT gas.

In the above embodiment and modification, three or more O-rings including the high-vacuum O-ring 58 and the low-temperature O-ring 60 may be used as the sealing members. In this case, O-rings respectively having different TR10 values may be adopted, or a part of an O-ring group may have the same TR10 value.

The invention claimed is:

1. An NMR measuring probe comprising:
   an inner wall body having a tubular hollow cavity that accommodates therein a sample vessel and in which a temperature adjustment gas is supplied;
   an outer wall body in which the inner wall body is inserted and that constitutes a vacuum vessel together with the inner wall body;
   an NMR signal detector that is arranged inside the vacuum vessel and is placed in a cooling state; and
   a sealing structure for sealing a sealed section between the inner wall body and the outer wall body,
   wherein the sealing structure includes
   a first sealing member having characteristics for sealing the sealed section in a regular temperature region excluding a low temperature region including a lower limit in a possible temperature adjustment range of the temperature adjustment gas, and
   a second sealing member that is provided on a vacuum side or an atmosphere side to the first sealing member in the sealed section and has characteristics for sealing the sealed section in the low temperature region in the temperature adjustment range.

2. The NMR measuring probe according to claim 1, wherein an embrittlement temperature of the first sealing member includes a first temperature, and an embrittlement temperature of the second sealing member includes a second temperature that is lower than the first temperature and the lower limit.

3. The NMR measuring probe according to claim 1, wherein the first sealing member is made of a fluorinated rubber material, and the second sealing member is made of a silicone rubber material.

4. The NMR measuring probe according to claim 1, wherein the second sealing member is provided on an atmosphere side with respect to the first sealing member in the sealed section.

5. The NMR measuring probe according to claim 1, wherein the second sealing member is provided on a vacuum side with respect to the first sealing member in the sealed section.

\* \* \* \* \*